(12) United States Patent
Matioli et al.

(10) Patent No.: US 10,985,253 B2
(45) Date of Patent: Apr. 20, 2021

(54) SEMICONDUCTOR DEVICES WITH MULTIPLE CHANNELS AND THREE-DIMENSIONAL ELECTRODES

(71) Applicant: ECOLE POLYTECHNIQUE FEDERALE DE LAUSANNE (EPFL), Lausanne (CH)

(72) Inventors: Elison de Nazareth Matioli, Lausanne (CH); Jun Ma, Prilly (CH)

(73) Assignee: ECOLE POLYTECHNIQUE FÉDÉRALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 16/349,545

(22) PCT Filed: Nov. 14, 2017

(86) PCT No.: PCT/IB2017/057083
§ 371 (c)(1),
(2) Date: May 13, 2019

(87) PCT Pub. No.: WO2018/087728
PCT Pub. Date: May 17, 2018

(65) Prior Publication Data
US 2019/0267454 A1    Aug. 29, 2019

Related U.S. Application Data

(60) Provisional application No. 62/421,393, filed on Nov. 14, 2016.

(51) Int. Cl.
*H01L 29/40*    (2006.01)
*H01L 29/205*    (2006.01)
(Continued)

(52) U.S. Cl.
CPC ........ *H01L 29/402* (2013.01); *H01L 29/2003* (2013.01); *H01L 29/205* (2013.01);
(Continued)

(58) Field of Classification Search
CPC ................. H01L 29/402; H01L 29/872; H01L 29/41766; H01L 29/7786; H01L 29/4236;
(Continued)

(56) References Cited

U.S. PATENT DOCUMENTS

2013/0334573 A1    12/2013  Ostermaier et al.
2014/0183629 A1*    7/2014  Meiser .................. H01L 21/383
                                                                                    257/337
(Continued)

OTHER PUBLICATIONS

International Search Report for PCT/IB2017/057083 dated Mar. 15, 2018, 5 pages.
(Continued)

*Primary Examiner* — Thanh Y. Tran
(74) *Attorney, Agent, or Firm* — Nixon & Vanderhye P.C.

(57) ABSTRACT

The present invention relates, for example, to a semiconductor structure containing multiple parallel channels in which several parallel conductive channels are formed within the semiconductor structure. Electric contact or electrostatic control over all these channels is done by three-dimensional electrode structures. The multiple channel structure with three-dimensional electrodes can be applied to semiconductors devices such as field effect transistors, diodes, and other similar electronic or quantum-effect devices. This structure is practical for materials where multiple parallel conduction channels can be formed, such as in III-V semiconductors. III-Nitride semiconductors with such structures are described which can lead to increased power density, reduced on-resistance and improved device performance, in addition to reducing dynamic on-resistance, and improving the stability of their threshold voltage and reliability.

20 Claims, 13 Drawing Sheets

(51) Int. Cl.
- *H01L 29/20* (2006.01)
- *H01L 29/43* (2006.01)
- *H01L 29/47* (2006.01)
- *H01L 29/778* (2006.01)
- *H01L 29/872* (2006.01)
- *H01L 29/417* (2006.01)
- *H01L 29/423* (2006.01)

(52) U.S. Cl.
CPC .... *H01L 29/41766* (2013.01); *H01L 29/4236* (2013.01); *H01L 29/432* (2013.01); *H01L 29/47* (2013.01); *H01L 29/7783* (2013.01); *H01L 29/7786* (2013.01); *H01L 29/872* (2013.01)

(58) Field of Classification Search
CPC . H01L 29/2003; H01L 29/205; H01L 29/432; H01L 29/7783; H01L 29/47
See application file for complete search history.

(56) References Cited

U.S. PATENT DOCUMENTS

| | | |
|---|---|---|
| 2014/0264273 A1 | 9/2014 | Howell et al. |
| 2015/0108499 A1* | 4/2015 | Alptekin ........... H01L 21/02507 257/77 |
| 2016/0293713 A1 | 10/2016 | Nechay et al. |
| 2016/0351564 A1* | 12/2016 | Azize ................ H01L 29/66621 |

OTHER PUBLICATIONS

Written Opinion of ISA for PCT/IB2017/057083 dated Mar. 15, 2018, 6 pages.

S. Takashima et al., "Sidewall Dominated Characteristics on Fin-Gate AlGaN/GaN MOS-Channel-HEMTs", IEEE Transactions on Electron Devices, vol. 60, No. 10, Oct. 1, 2013, pp. 3025-3031.

J. Ma et al., "Enhanced Electrical Performance and Heat Dissipation in AlGaN/GaN Schottky Barrier Diodes Using Hybrid Tri-anode Structure", IEEE Transactions on Electron Devices, vol. 63, No. 9, Sep. 1, 2016, pp. 3614-3619.

* cited by examiner

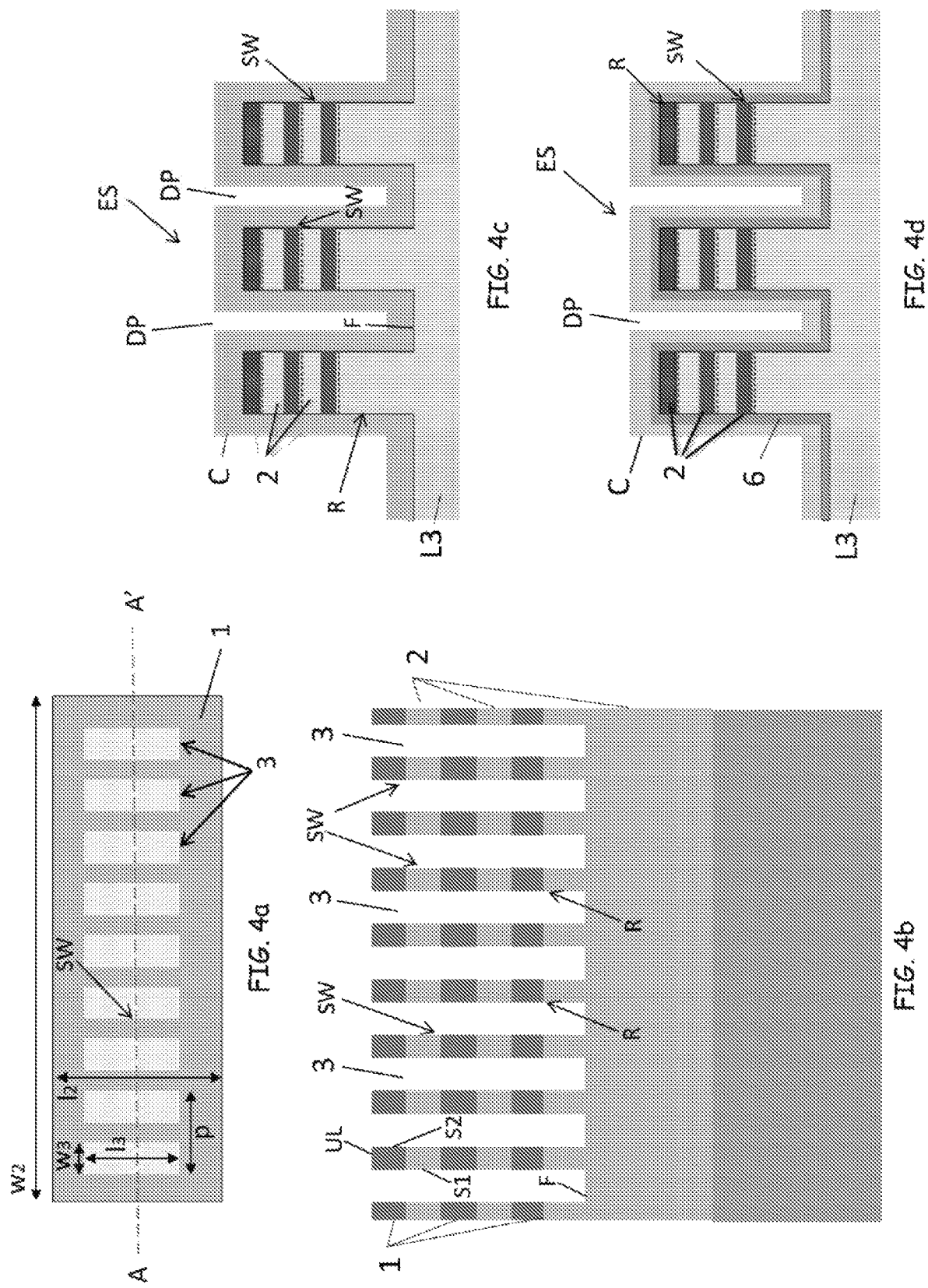

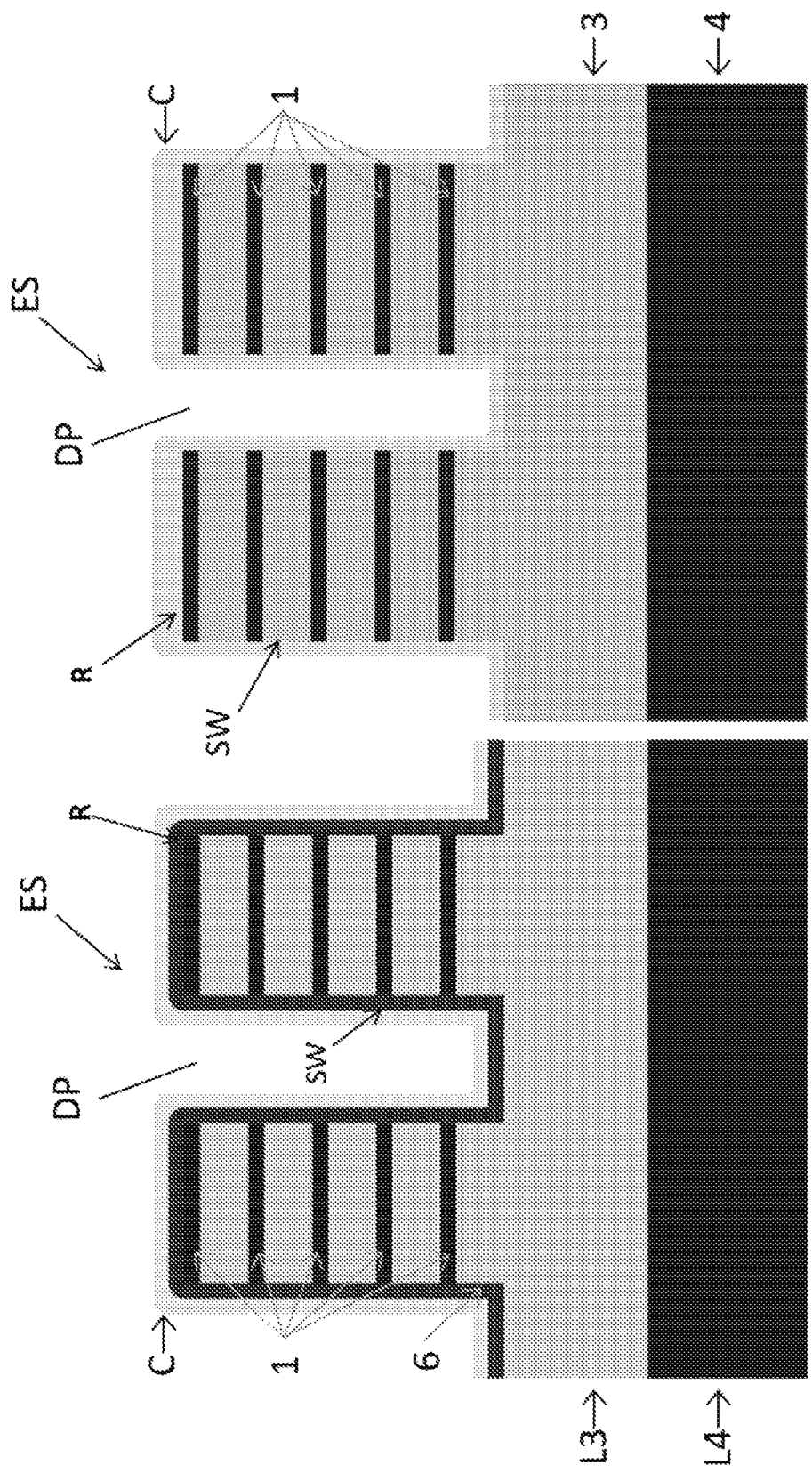

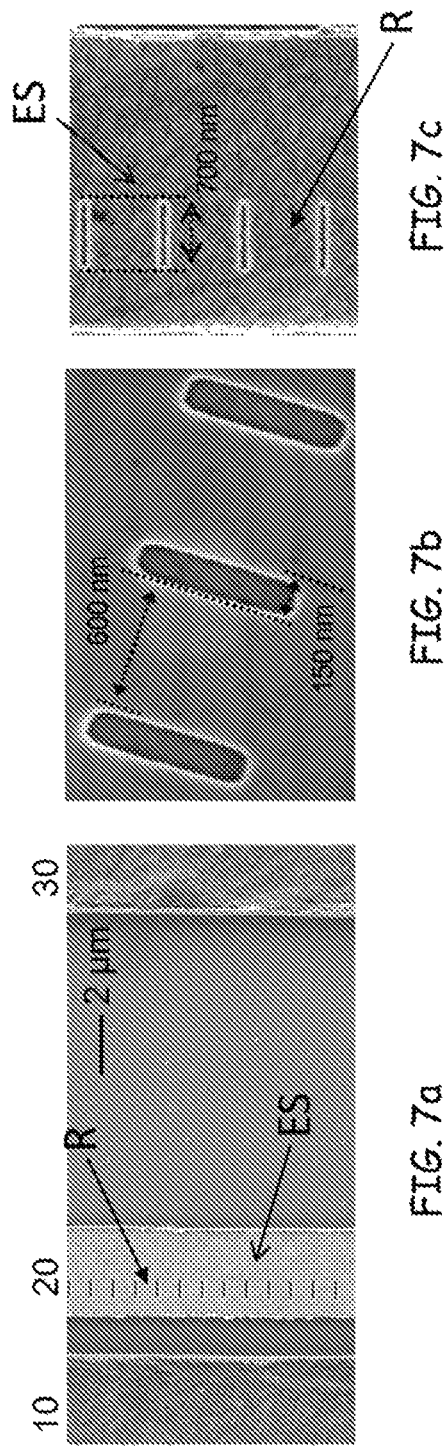

Table 2. Channel conductivity of different GaN heterostructures.

| Reference | Barrier | Number of Channels | Growth technique | $R_s$ (ohm/sq) | $N_s$ ($\times 10^{13}$/cm$^2$) | $\mu$ (cm$^2$/V·s) |
|---|---|---|---|---|---|---|
| [19] | Al$_{0.27}$Ga$_{0.73}$N | 1 | MOCVD | 350 | 1 | 1800 |
| [18] | InAlN | 1 | MOCVD | 182 | 4.2 | 812 |
| [17] | InAlGaN | 1 | MOCVD | 195 | 1.8 | 1770 |
| [16] | AlN | 1 | MOCVD | 235 | 2.15 | 1250 |
| [15] | AlN | 1 | MBE | 129 | 3.2 | 1513 |
| [16] | | 3 | MOCVD | 335 | -- | -- |
| [16] | Al$_{0.25}$Ga$_{0.75}$N | 5 | MOCVD | 205 | -- | -- |
| | | 8 | MOCVD | 138 | -- | -- |
| [15] | AlN | 9 | MBE | 37 | 10.8 | 1567 |

Figure 10

SEMICONDUCTOR DEVICES WITH MULTIPLE CHANNELS AND THREE-DIMENSIONAL ELECTRODES

CROSS-REFERENCE TO RELATED APPLICATIONS

The application is the U.S. national phase of International Application No. PCT/IB2017/057083 filed Nov. 14, 2017 which designated the U.S. and claims priority to US Provisional Patent Application No. 62/421,393 filed on Nov. 14, 2016, the entire contents of each of which are hereby incorporated by reference.

FIELD OF THE INVENTION

The present invention relates to a semiconductor structure or device comprising a plurality of stacked heterostructures as well as at least one electrode structure comprising at least one recess extending within or through the plurality of heterostructures and a conductive electrode formed in the recess and contacting or provided on the plurality of heterostructures.

The present invention relates, for example, to a semiconductor structure containing multiple parallel channels in which several parallel conductive channels are formed within the semiconductor structure. Electric contact or electrostatic control over all these channels is done by three-dimensional (3D) electrode structures.

The multiple channel structure with three-dimensional electrodes can be applied to semiconductors devices such as field effect transistors, diodes, and other similar electronic or quantum-effect devices. This structure is practical for materials where multiple parallel conduction channels can be formed, such as in III-V semiconductors. III-Nitride semiconductors with such structures are described as an exemplary embodiment, which can lead to increased power density, reduced on-resistance and improved device performance.

The techniques described herein relate to semiconductor structures that can reduce the device on-resistance, increase their current density, in addition to reducing their dynamic on-resistance, and improving the stability of their threshold voltage and their reliability. Degradation on dynamic on-resistance and reliability is generally caused by surface traps, whose density can be similar to the electron density in two-dimensional electron gases (2DEGs) present in such devices. In a multi-channel structure, the density of the 2DEG can be significantly increased, and will be more distant from the surface, thus reducing their dependence to traps. Such structures can, for example, be used advantageously for Al,In,Ga-Nitride semiconductor devices.

BACKGROUND

III-Nitride semiconductors offer inherent advantages for high-efficiency power and radio-frequency (RF) electronic devices. Their excellent electronic properties such as large breakdown field and high electron saturation velocity result in smaller on-resistance ($R_{on}$) with larger breakdown voltage ($V_{bk}$) than in SiC and Si power devices, as well as 3-5× higher microwave power density than GaAs- and Si-based RF technology. Additionally, GaN-based heterostructures are able to create conduction channels with high-density 2DEG and high electron mobility, enabling high electron mobility transistors (HEMTs) or other lateral electronic devices, such as diodes, with simultaneously fast switching, high power density and high breakdown voltage, along with high efficiency, small device size, high frequency and temperature operation. These properties make this material system ideal material for future power and RF systems.

The challenge however is that the performance of current III-Nitride devices is very far from the fundamental materials limits. Their future adoption for efficient power/RF systems depends on solving the current main issues simultaneously, which includes increasing power density, reducing on-state resistance and enhancing blocking voltage.

This present disclosure describes device architectures based on several parallel conductive channels that leads to significantly reduced on-resistance and enhanced power density. The effective control and contact to these channels is achieved through three-dimensional electrodes through trenches on the semiconductor structure, which is applied for all contacts, such as ohmic, Schottky or gate contacts.

Technical Rationale and Approach

III-Nitride semiconductors offer clear advantages over Si, GaAs and SiC in terms of specific on-resistance $R_{on}$, power density and breakdown voltage $V_{bk}$, making them ideal for power and RF electronics. For a given breakdown voltage, GaN yields a much lower $R_{on}$ and a higher power density which allow smaller devices with reduced capacitances and hence lower switching losses. This figure of merit is even more relevant when considering that GaN devices can operate at much higher frequencies than Si and SiC devices.

The breakdown voltage of GaN HEMTs has improved continuously over the years. The first 1 kV AlGaN/GaN HEMT grown on semi-insulating SiC substrate was reported in 2001 with $R_{on}$ of only 3.4 mΩ·cm². In 2006, 1.6 kV breakdown voltage was demonstrated in an AlGaN/GaN HEMT grown on sapphire substrate, later reaching up to 1.9 kV with $R_{on}$ as low as 2.2 mΩ·cm². Lateral power devices with breakdown voltages over 8000 V on sapphire substrates have been demonstrated for gate-to-drain distance of over a 120 μm. However, this large gate-to-drain distance leads to a high $R_{on}$ of 186 mΩ·cm². This illustrates one of the trade-offs with lateral power devices: large breakdown voltages require large gate-to-drain spacing, leading to large on-resistances.

To further push the progress of GaN electronic devices, $R_{on}$ must be reduced and the power density of the devices needs to be enhanced. To achieve such goals, a highly conductive 2DEG channel is necessary. In commercially available AlGaN/GaN structures, the Al composition and thickness of the AlGaN barrier layer are about 23%-30% and ~20 nm, respectively, corresponding to a sheet resistance ($R_s$) of 350-500 ohm/sq. Recently, high-Al-composition AlGaN, AlN, InAlN and InAlGaN barriers are being intensively investigated for reduction of $R_s$. Due to the strong polarization effect in such Al-rich barriers, the 2DEG density is increased and $R_s$ as small as 182 ohm/sq has been achieved by metalorganic chemical vapor deposition (MOCVD). However, the growth of these barriers is very challenging because of the poor surface immigration of Al and low incorporation efficiency of In atoms, which cause significant reliability issues and huge degradation in voltage blocking capability for HEMTs. More importantly, such structures have only one 2DEG channel, which is already approaching its limits in terms of conductivity or equivalently the $R_s$.

Here, a multiple channel (multi-channel) structure with a three-dimensional electrode (3D electrode) according to the present disclosure is disclosed to overcome these challenges. A multi-channel structure containing multiple 2DEG channels on a single wafer is aimed to reduce R, while a 3D electrode architecture including, for example, two sidewall gates as well as a planar top gate will provide simultaneous gate control over the stacked channels. The threshold voltage ($V_{TH}$) of the multi-channel 3D electrode HEMTs can be controlled by the width of the nanowires for e-mode HEMTs with normally-off operation.

GaN multi-channel structures were first proposed in the year of 2001, in which 2DEG density increases with increasing number of barrier/channel stacks, resulting in better channel conductivity than single-channel structures. Table 2 of FIG. 10 compares the state-of-the-art channel conductivity of various III-nitride single-channel and multi-channel structures, which shows that multi-channel structures exhibit significantly smaller $R_s$ with respect to the single-channel structure. Based on an AlN/GaN 9-channel structure, $R_s$ down to 37 ohm/sq has been achieved with a sheet carrier density ($N_s$) of $1.08 \times 10^{14}/cm^2$ and an electron mobility of 1567 $cm^2/V \cdot s$. This leads to a reduction of about 10 times in $R_s$ as compared to conventional AlGaN/GaN SC structures, which is extremely promising for high-end GaN HEMTs beyond the materials limit.

However, up to now the superior channel conductivity of the multi-channel structure could not be utilized for devices. The first obstacle is the insufficient gate control in multi-channel planar HEMTs over buried channels. This greatly reduces the transconductance, increases the leakage current, increases short-channel effects and degrades the $V_{br}$ of the HEMT, which are detrimental for electronic devices and power switches. Furthermore, although the large 2DEG density in the multi-channel structure can reduce the $R_s$, the fabrication of GaN E-mode HEMTs would be more challenging and traditional technologies such as shallow gate recess, $F^+$ implantation and p-GaN cap will no longer be applicable.

Finally, the multi-channel structure grown by MOCVD is not as conductive as expected due to the difficulty in material growth. Although Molecular Beam Epitaxy (MBE) is used as the alternative and it can provide highly conductive multi-channel structures, it is not suitable for mass production and its low growth temperature leads to increased defect density.

The 3D electrode (tri-gate) architecture is recently becoming interesting for GaN single-channel HEMTs for normally off applications and other advantages in superior gate control, current stability as well as thermal management. However, this structure has an essential drawback: 2DEG in gate region needs to be selectively removed by etching to achieve the tri-gate structure, and the remaining heterostructure will partially relax, leading to a largely degraded $R_{on}$ for the HEMT. Such degradation in $R_{on}$ reduces the current handling capability of the HEMT and makes the tri-gate structure less promising for power applications.

To unveil the potential of the tri-gate for multi-channel HEMTs, the degraded $R_{on}$ must be resolved or mitigated, and the benefits from the tri-gate structure needs to be fully understood and explored.

The multi-channel structure offers superior channel conductivity which cannot be controlled by conventional planar gate, thus its excellent channel conductivity is much less meaningful. The 3D electrode provides superior gate control with other benefits, yet it degrades the $R_{on}$ of the HEMTs.

SUMMARY

The present disclosure addresses the above-mentioned inconveniences and problems and provides a semiconductor structure or device according to claim 1.

A semiconductor structure or device is provided comprising a plurality of heterostructures, each heterostructure being formed by at least one first semiconductor material or layer in contact with at least one second semiconductor material or layer. The semiconductor structure or device further comprises at least one electrode structure comprising at least one recess extending within or through the plurality of heterostructures of the semiconductor structure or device and a conductive electrode. The conductive electrode is formed in the at least one recess and contacts or is provided on the plurality of heterostructures.

Further advantageous features can be found in the dependent claims.

It is extremely promising to combine and engineer the multi-channel and tri-gate structures for a multi-channel tri-gate HEMT architecture, which is one purpose of the present disclosure.

The exemplary 3-dimensional tri-gate can effectively control the buried multiple channels and the excellent channel conductivity of the multi-channel structure can greatly reduce the $R_{on}$ of the tri-gate HEMTs.

In addition, the 3D electrode architecture can address the challenges of electrical contact over all buried channels, such as ohmic and schottky, as the multiple parallel channels can be electrically contacted through the sidewall of trenches that form the 3D electrodes. Ohmic and schottky contacts can be easily formed this way.

This technology can lead to a new-generation GaN electronic devices with simultaneously small $R_{on}$, large current and power density, low leakage current, high $V_{br}$, reduced self-heating, enhanced temperature stability, diminished current collapse and suppressed threshold hysteresis.

Some embodiments relate to a semiconductor structure comprising multiple conductive layers embedded within the semiconductor (multiple channel structure).

Some embodiments relate to a field effect transistor based on such multiple channel structure, including a source, gate and drain regions.

The source and/or drain regions can include a conductive electrode formed in trenches.

The field effect transistor can also include a conductive electrode having conductive regions formed in the trenches along a direction between the source region and the drain region.

The conductive electrode can extend no more than a portion of a distance between the source region and the drain region.

The field effect transistor may also has an insulating region between the semiconductor region or material and the conductive electrode.

Some embodiments relate to a diode including a multiple channel structure having trenches formed therein. The diode includes a conductive electrode forming an anode and a conductive electrode forming the cathode of the diode. The conductive electrode can include conductive regions formed in the trenches of the multiple channel structure.

Some embodiments relate to a method of forming the multiple channel structure. The method includes depositing multiple stacks of semiconductor regions on top of each other to form the multiple channel structure.

The conductive layers can be formed by heterostructures of III-V semiconductors. The III-V semiconductors can be formed of III-Nitride materials (GaN, InGaN, AlGaN, AlN, InAlN, etc. . . . ), which create a two-dimensional electron gas at their interface.

The method also includes forming trenches in the multiple channel structure. The method can also include forming an insulating region over at least a portion of the multiple channel structure. The method may also include forming conductive electrode regions in the trenches of the semiconductor region.

A BRIEF DESCRIPTION OF SEVERAL VIEWS OF THE DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

FIG. 1a and FIG. 1b show a cross section view of a multiple channel structures formed at the interface of each heterostructure (between material 1 and 2, or S1 and S2) embedded inside the semiconductor, according to some embodiments, the entire structure can be formed over a substrate of the same or different material (region 3), the substrate may contain several semiconductor layers.

FIG. 4a shows a top view of a multiple channel structure in which portions of the electrode structure are formed in trenches in the multiple channel structure, according to some embodiments.

FIG. 4b shows a cross section of a multiple channel structure in which lower portions of the electrode structure are formed in trenches in the multiple channel structure, according to some embodiments.

FIG. 4c shows a cross section of a multiple channel structure after deposition of conductive (region 1) materials, in which lower portions of the electrode structure are formed in trenches in the multiple channel structure, according to some embodiments.

FIG. 4d shows a cross section of a multiple channel structure after deposition of dielectric (region 6) and conductive (region C) materials, in which lower portions of the electrode structure are formed in trenches in the multiple channel structure, according to some embodiments.

FIG. 6b shows a cross section of the electrode (ES) structure along A-A' line in FIG. 6a, which is formed in trenches in the multiple channel structure with an insulating region (6) between the conduction electrode and semiconductor, according to some embodiments.

FIG. 6c shows a cross section of the electrode (30) structure along B-B' line in FIG. 6a, which is formed in trenches in the multiple channel structure no insulation between the conduction electrode and semiconductor, according to some embodiments.

FIG. 7a shows a top-view SEM image of a field effect transistor where the gate electrode (20) contains deep etched trenches, according to some embodiments.

FIG. 7b shows a zoomed-in top-view SEM image of deep etched trenches before deposition of insulation and conductive materials, according to some embodiments.

FIG. 7c shows a zoomed-in top-view SEM image of deep etched trenches after deposition of insulation and conductive materials, according to some embodiments.

FIG. 10 contains a Table comparing the state-of-the-art channel conductivity of various III-nitride single-channel and multi-channel structures, which shows that multi-channel structures exhibit significantly smaller Rs with respect to the single-channel structure.

DETAILED DESCRIPTION OF SEVERAL EMBODIMENTS

III-Nitrides for example can induce 2DEGs (polarization-induced) with unusually large electron density and high mobility, near the barrier/GaN interface. The most common configuration of high electron mobility transistors (HEMTs) contains a single electron channel (single 2DEG) formed with a barrier layer, typically of AlGaN, InAlN, AN, etc., in contact with GaN.

One aspect of this disclosure concerns HEMT structures composed of multiple barriers stacked in the same device to induce multiple 2DEGs flowing in parallel within the device. This technology can significantly increase device current and output power for a similar device area, while reducing on-resistance, or in other words, significantly increase power density while reducing losses for a similar cost.

The multiple channels III-Nitride materials can for example be obtained by multiple heterostructures formed with a barrier material (region 1 (S1; S3; S5) in FIG. 1a (FIG. 1b)) and for example GaN (region 2 (S2, S4; S6) in FIG. 1a (FIG. 1b)).

Figure 1A:
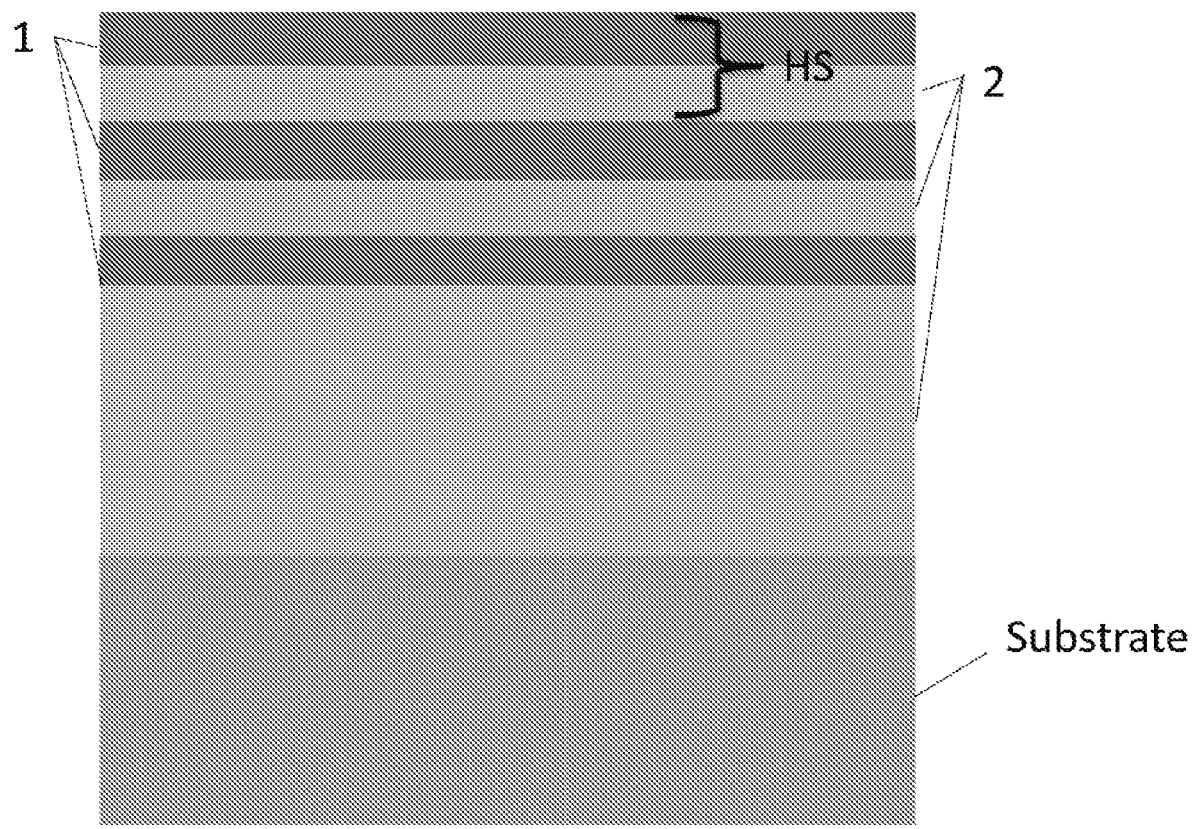
Figure 1B:
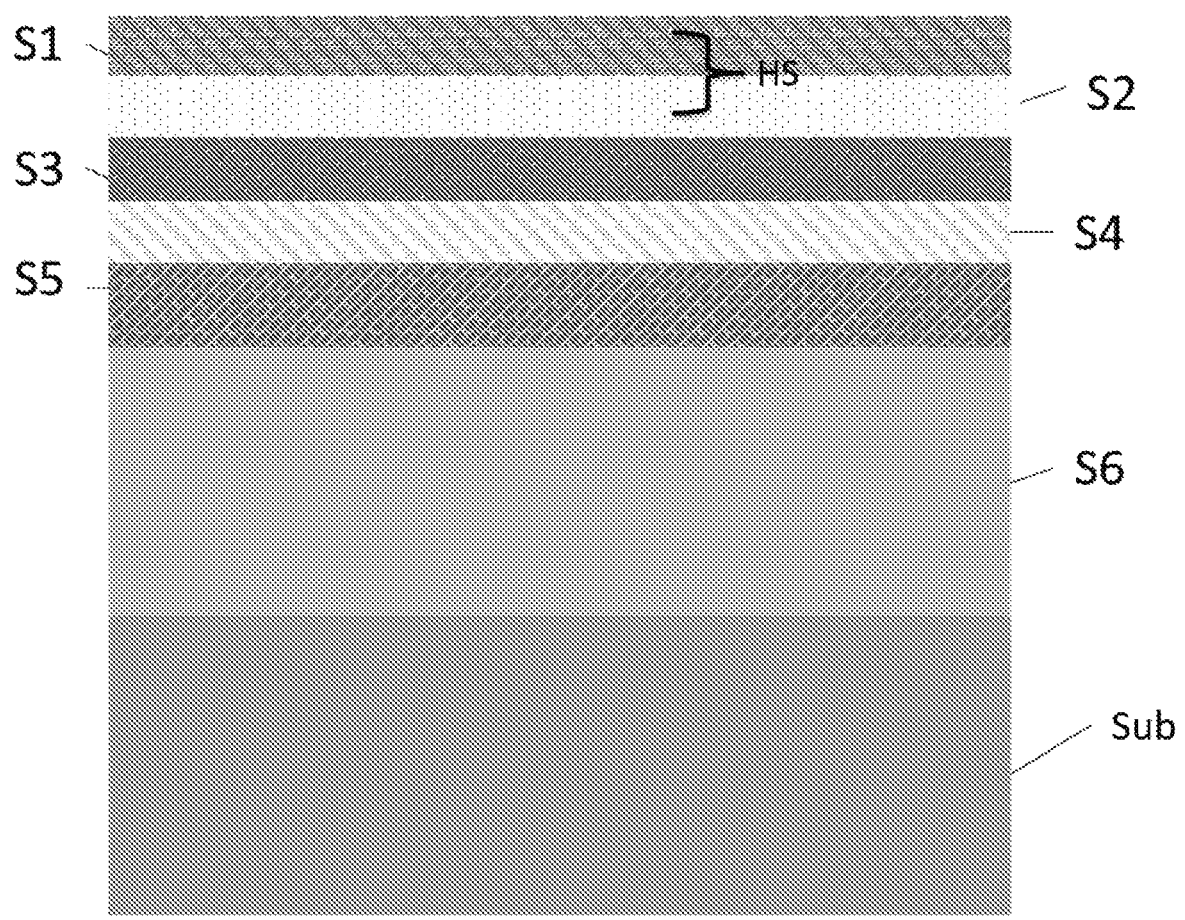
Figure 6A:
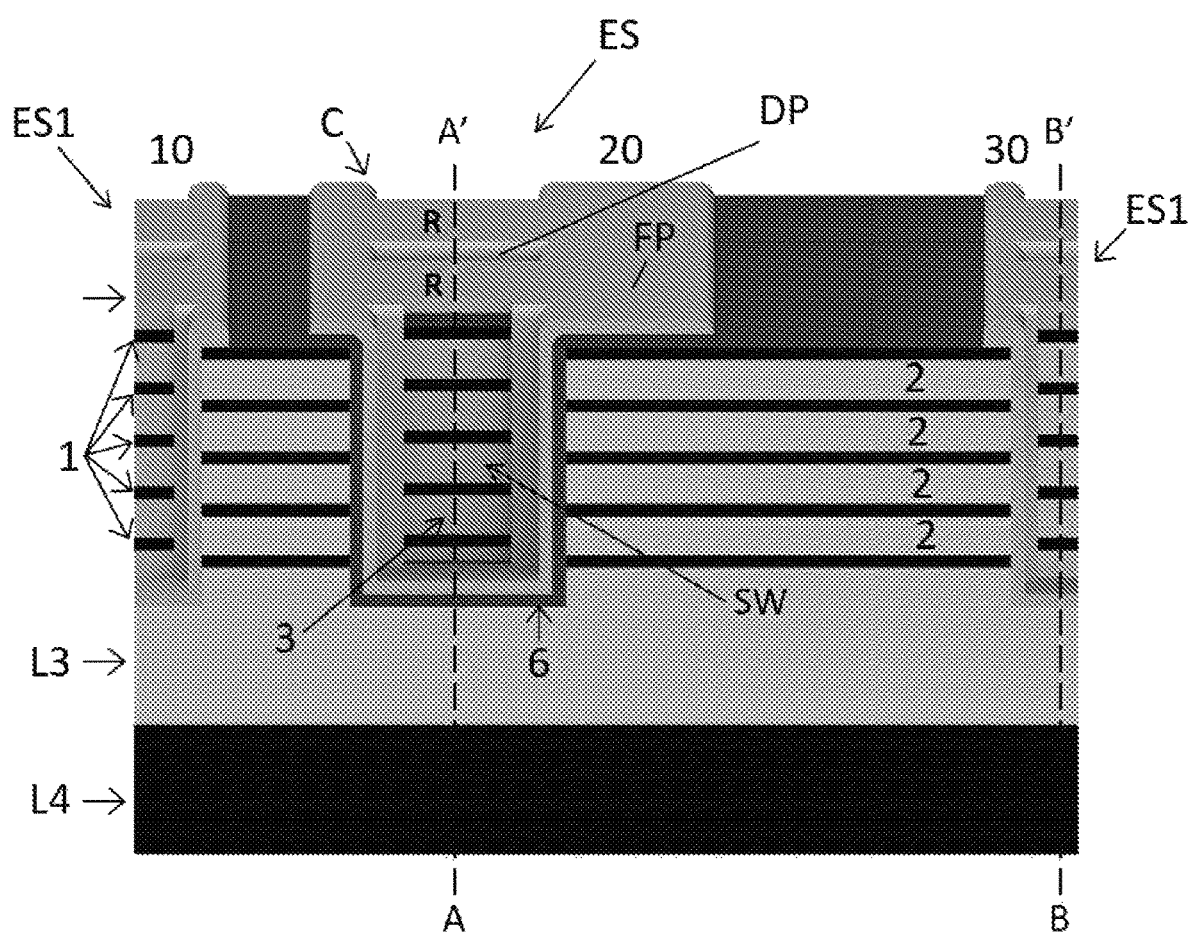
FIG. 6a shows a field effect transistor based on such multiple channel structure, including a source region (10), drain region (30) and an electrode structure (ES) formed in trenches in the multiple channel structure, according to some embodiments.

FIGS. 1a and 1b as well as FIGS. 6a to 6c show different aspects of the semiconductor structure or device according to the present disclosure.

The semiconductor structure or device comprises a plurality of heterostructures HS. Each heterostructure HS is formed by at least one first semiconductor material or layer 1, S1, S3, S5 in contact with or directly in contact with at least one second semiconductor material or layer 2, S2, S4, S6.

The first and second semiconductor materials or layers of heterostructure comprise for example different semiconductor materials having for example different band gaps.

The first or second semiconductor materials may be doped, or the first and second semiconductor materials may have different doping levels.

The semiconductor structure or device can include one or more other layers upon which the plurality of heterostructures HS are provided such as semiconductors layer S6, L3 that may be the same or different to the first or second semiconductor layers. The semiconductor structure or device can also include a substrate L4, Sub upon which the plurality of heterostructures HS are directly provided, or include other intermediate semiconductor layers between the substrate and the plurality of heterostructures HS.

Each first semiconductor material or layer of each heterostructure of the plurality of heterostructures can be formed of a similar or identical semiconductor material, and each second semiconductor material or layer of each heterostructure of the plurality of heterostructures can be formed of a similar or identical semiconductor material.

Each first semiconductor material or layer of each heterostructure of the plurality of heterostructures can be formed of a different semiconductor material, and each second semiconductor material or layer of each heterostructure of the plurality of heterostructures can be formed of a different semiconductor material.

The first semiconductor material or layer and the second semiconductor material or layer can be planar layers and the at least one recess 3 extends through the planar layers.

The semiconductor structure or device also includes at least one electrode structure ES comprising at least one recess 3 extending within or through the plurality of heterostructures HS of the semiconductor structure or device. The electrode structure ES also includes a conductive electrode C. The conductive electrode C is for example formed in the recess 3 and contacts or is provided on the plurality of heterostructures. The conductive electrode C may include, for example, a metal or a metal alloy.

The electrode structure ES controls a current in a plurality of current channels formed by the plurality of heterostructures at or in proximity to a heterostructure interface.

The current channel is for example located in the first or second semiconductor material or layer of lower bandgap.

A current channel is for example formed at or in proximity to the heterojunction of the heterostructure.

The electrode structure is configured to simultaneously control a current in current channels formed by the plurality of heterostructures. The plurality of heterostructures comprises a plurality of stacked heterostructures defining a plurality of stacked parallel conductive current channels.

The number of heterostructures providing a current channel is, for example, at least 2, or at least 3 or at least 4, or at least 5 or at least 6 or at least 7.

The plurality of carrier channels is a plurality of buried carrier channels. The plurality of heterostructures can form for example a plurality of 2DEG channels.

The recess, recesses or each recess 3 can extend into the plurality of heterostructures beyond the plurality of current channels formed by the plurality of heterostructures, as for example, shown in FIGS. 4c and 4d.

The stacked materials or layers can, for example, include a non-recessed portion, and a recessed portion including the electrode structure ES.

The plurality of heterostructures define a side wall SW and the conductive electrode C contacts or directly contacts or is provided on the side wall SW. The conductive electrode C can partially cover or fully cover the side wall SW. The conductive electrode C contacts or is provided on the at least one side wall to permit simultaneous control of a current in the plurality current channels.

An insulating material or layer 6 may optionally be provided between the semiconductor material or layer and the conductive electrode C. Any suitable type of insulating material may be used for insulating material 6 such as dielectrics including oxides (e.g., silicon oxide), nitrides (e.g., silicon nitride), etc.

The electrode structure may comprise at least two recesses 3 that define a semiconductor region R therebetween. The semiconductor region R includes a plurality of heterostructures forming a plurality of current channels. The electrode structure may comprise a plurality of recesses 3, where the plurality of recesses 3 define a plurality of semiconductor regions R therebetween. The semiconductor region R comprises or defines a plurality of channels for example nano-channels.

One or more of the recesses 3 may, for example, extend inside the plurality of semiconductor materials or layers 1,2 in an elongated extension direction or manner.

The form of the semiconductor region R is defined by the shape of the recesses 3.

The semiconductor region R can extend in an elongated manner and may, for example, form a (semiconductor) finger. Different exemplary shapes of the semiconductor region R can be seen from FIGS. 5a to 5h, for example, the region R of FIG. 5d has an 'hour-glass' shape, while the region R of FIG. 5f has a funnel shape.

The semiconductor region R can include for example a first side wall S1, a second side wall S2 and an upper surface or upper level UL extending between the first S1 and second S2 side walls. The conductive electrode C extends along the first side wall S1 to form a first side wall gate, the second side wall S2 to form a second side wall gate and the upper surface UL to form a top gate to provide simultaneous gate control over the plurality of current channels.

The insulator material or layer can be provided on all side walls and/or on the connecting upper level UL of the semiconductor region R.

The recess or recesses 3 can include a floor F. The floor F can extend between the first Si and second S2 side walls. The conductive electrode C may also extend to partially or fully cover the floor F.

The conductive electrode C extends to partially fill the recess, recesses or each recess 3. The conductive electrode C can extend to partially fill the recess, recesses or each recess to define a depression DP therein. The conductive electrode C may partially cover or fully cover the semiconductor region R.

The conductive electrode C can form for example a Schottky or ohmic contact with the plurality of heterostructures.

The electrode structure ES may also define a field plate structure configured to increase a breakdown voltage of the structure or device, or include at least one field plate electrode FP for increasing a breakdown voltage of the structure or device (see FIG. 6a, for example). The field plate electrode FP can comprise an electrode in contact or provided on the plurality of heterostructures. The electrode of the field plate FP is, for example, provided on an external semiconductor material or layer to defines an external surface of the semiconductor structure or device. The field plate electrode FP can, for example, contact or be integral with the conductive electrode C.

The electron density of the 2DEG channels formed at an interface of these heterostructures can be tuned by changing the thickness and alloy concentration of each of these layers. The first challenge is on the design of the multi-channels, including barrier material and thickness of layers, to yield large carrier density and small on-resistance.

Several different materials such as for example high Al content AlGaN, AlInN, AlN, AlGaInN can be used as barrier material to engineer the device band structure, increase carrier density and reduce both surface and alloy scatterings. The thickness of the barrier and GaN layers is important in maximizing the carrier density, to guarantee that all middle channels are populated and minimizing the generation of holes.

Figure 2:
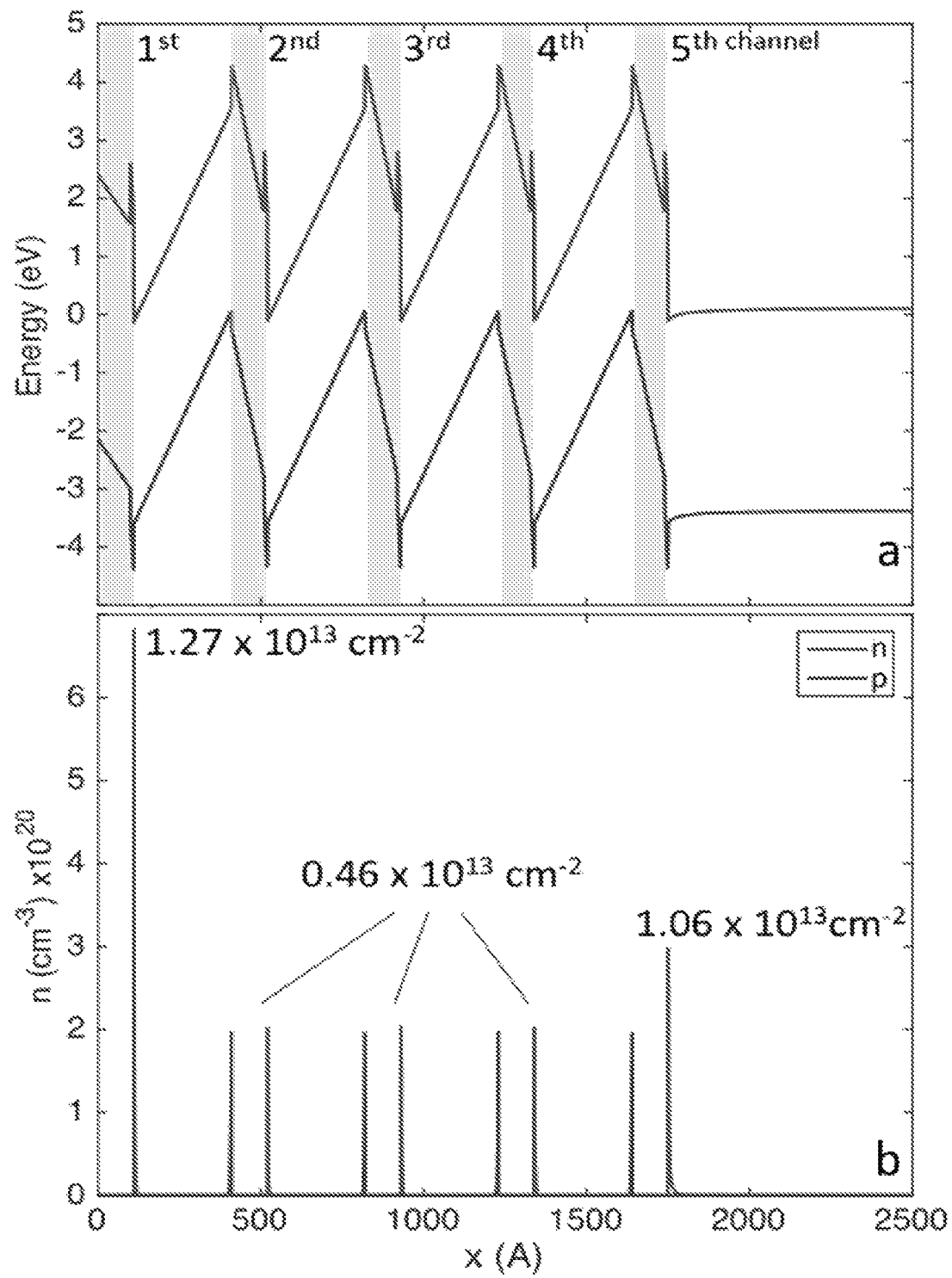
FIG. 2a shows a simulation of 5×-channel of 10 nm-thick $Al_{0.40}GaN$ barriers and 30 nm-thick GaN channels with AlN interlayers, according to some embodiments.
FIG. 2b shows the simulated carrier density at each of the $Al_{0.40}GaN$—GaN interfaces.

FIG. 2 shows a simulation of the band structure of an exemplary embodiment with 5-stack $Al_{0.40}GaN/GaN$ with AlN interlayers resulting in a carrier density of $3.7 \times 10^{13}$ $cm^{-2}$, which is 3×-larger than that for a single barrier. This can be much improved with an optimal multi-barrier structure.

Figure 3:
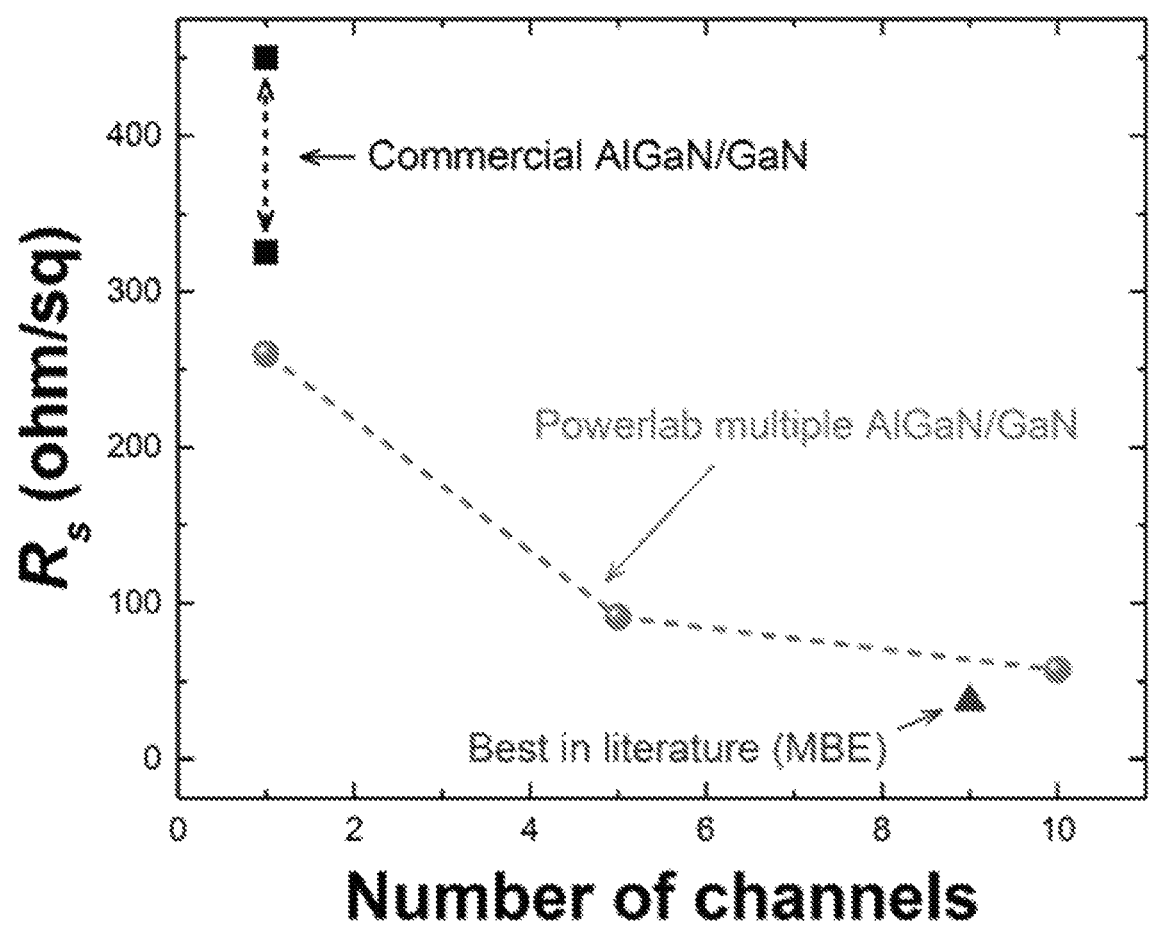
FIG. 3 shows the experimental sheet resistance versus number of channels of an embodiment of a multiple channel structure as described herein.

The second challenge is on the growth of these stacked multi-barriers by MOCVD. The difference in growth conditions of the barrier and channel materials poses challenges for the quality of these layers. The thickness of the barrier material and the number of stacks can be optimized to avoid strain relaxation, which would deplete most of the piezo-electric-polarization induced carriers in the 2DEG. One exemplary embodiment is with AlN since it offers the largest piezoelectric polarization field among these materials, therefore allowing much thinner layers and yielding larger electron concentrations. The feasibility of the growth of such multi-barrier structures has been demonstrated by molecular beam epitaxy (MBE), however devices have not been demonstrated due to the challenging gate control of all these multi-channels. This disclosure addresses this challenge by deep nanostructured gates (deep 3D gates). In addition, the growth of the multi-barrier structures can be done by MOCVD, which is a much more scalable technique, thus offering a more promising future impact. FIG. 3 shows a proof of concept for the growth of these multi-channel wafers by MOCVD.

The third challenge is on the simultaneous gate control over all these multi-channels, as previously mentioned. Gate electrodes in GaN-based transistors (HEMTs and MISFETs) are currently placed at the surface of the barrier material, which is the cause of some of the current challenges in today's lateral devices with a single 2DEG, such as short-channel effects and high drain leakage current in power devices. These challenges would be much more severe in multi-channel devices, leading to even larger short-channel effects, poor on/off ratio and large drain leakage current. Such issues have already been observed in double-channel GaN HEMTs, and would be much more drastic for several channels. Deep nanostructured gates reaching below all these parallel 2DEG channels (see for example FIG. 4) can effectively control and deplete all electrons in the multiple 2DEGs.

Such structure can be achieved, for example, by a lithography step to define the trench regions that will be etched (region 3 in FIG. 4a). Several geometries: period p, length $l_3$, full length $l_2$, width w3 and full width w2 as well as shapes of the trench region 3 can be considered. Material in the trench region 3 can be etched by dry-etching using $Cl_2$-based chemistry in the case of III-Nitride semiconductors.

The depth of the recesses 3 formed in the semiconductor materials or layers depends on the number of heterostructures but can be for example between about 300 nm and 1000 nm or 1500 nm; or 500 nm and 1000 nm or 1500 nm. The width w3 for the recesses 3 formed in the semiconductor layers can be for example between about 100 and 400 nm, for example 150 nm. The length $l_3$ for the recesses 3 formed in the semiconductor layers can be for example between about 650 and 750 nm, for example 700 nm. The period p can be for example between 700 and 800 nm, for example 750 nm. The width of the region R can be for example between 200 and 1000 nm, for example 600 nm.

FIG. 4b shows a cross section along A-A' cut in FIG. 4a of a possible embodiment after trench etching.

FIG. 4 c,d show one embodiment of the multi-channel structure after the trench region 3 has been covered by a dielectric material (region 6 in FIG. 4d) and conductive material (region C in FIG. 4c) on the dielectric material to form a gate electrode for field effect devices.

FIG. 5a-h show top views of trench structure with recesses of different sizes and shapes. Any suitable shapes and sizes can be used.

Figure 5A:
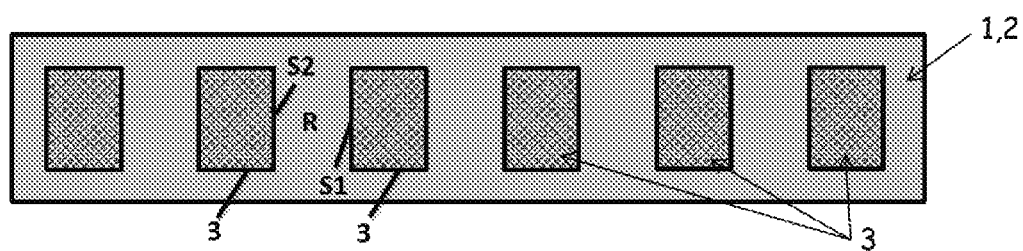
FIG. 5a-5d show a top-view of the trenched structure with recesses of different shapes, according to some embodiments.

The two recesses 3 may, for example, define the semiconductor region R comprising the first side wall S1 and the second side wall S2, where the first side wall S1 and second side wall S2 extending substantially parallel to each other (see for example FIG. 5a). The first side wall S1 and second side wall S2 may alternatively extend convergently or divergently with respect to each other (see for example FIG. 5c, 5d).

Figure 5B:
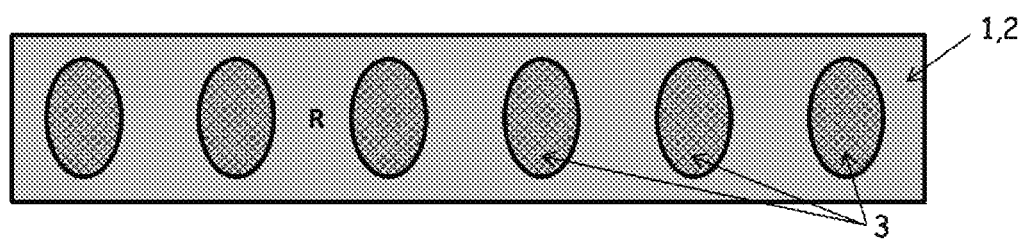
Figure 5C:
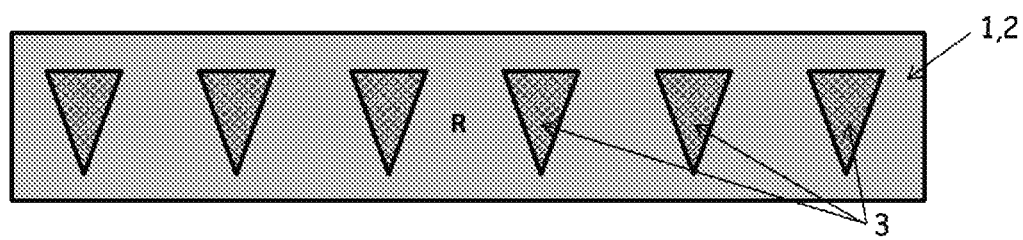
Figure 5D:
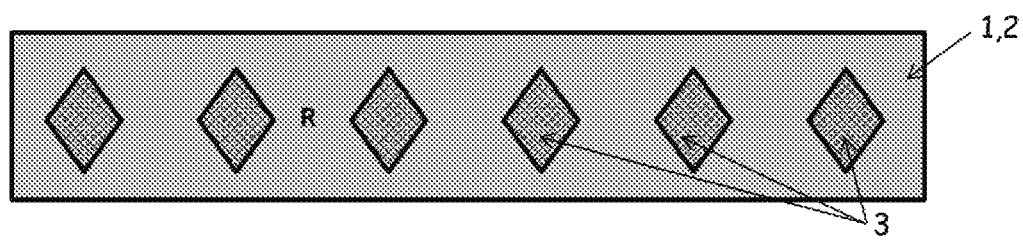
Figure 5E:
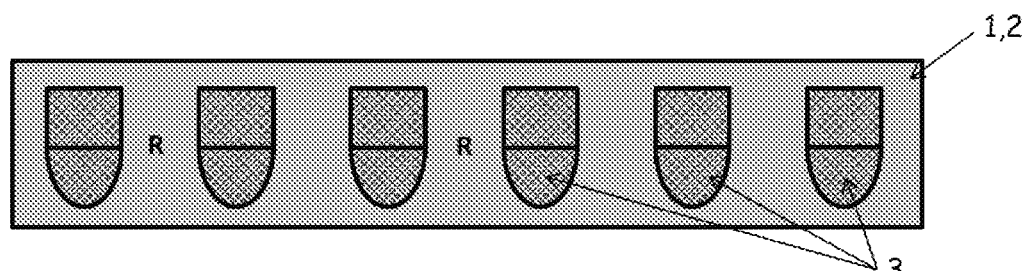
FIG. 5e-5f show a top view of the trenched structure with recesses of irregular shapes and sizes, according to some embodiments.
Figure 5F:
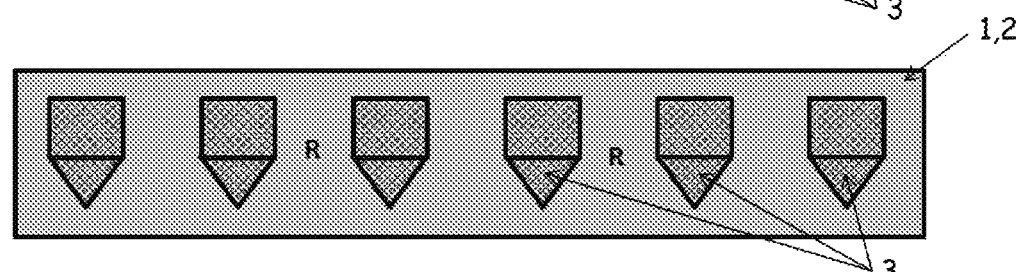

The first side wall S1 and second side wall S2 may for example include (i) a first portion in which the first side wall S1 and second side wall S2 extend substantially parallel to each other and (ii) a second portion in which the first side wall S1 and second side wall S2 extend convergently or divergently with respect to each other (see for example FIG. 5f).

The first side wall S1 and second side wall S2 may extend in a curved manner (see for example FIG. 5b).

The first side wall S1 and second side wall S2 may for example include (i) a first portion in which the first side wall S1 and second side wall S2 extend substantially parallel to each other and (ii) a second portion in which the first side wall S1 and second side wall S2 extend in a curved manner (see for example FIG. 5e).

Figure 5G:
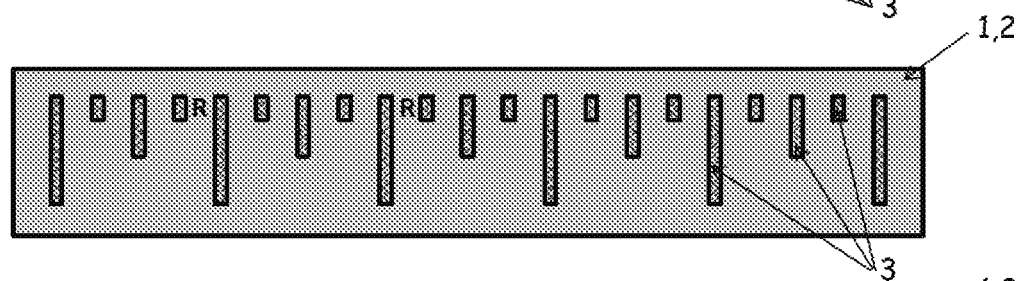
Figure 5H:
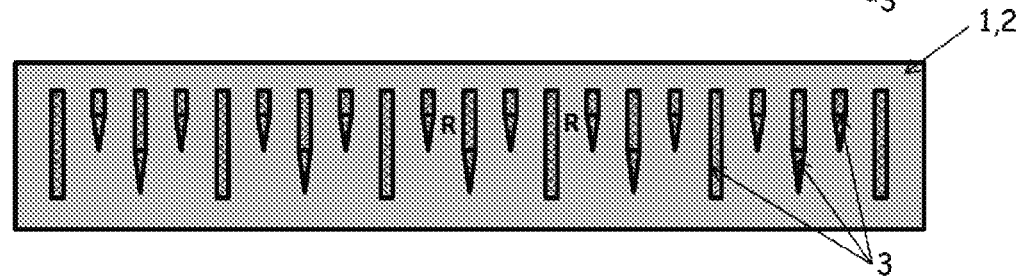

Recesses 3 of different shapes may be used, and the first side wall S1 may extend a shorter distance than the second side wall S2 (see for example FIG. 5g, 5h).

The structure or device can be a field effect transistor comprising a source region 10 and a drain region 30 provided on the above described multi-channel structure or device, the electrode structure ES defining a gate electrode of the field effect transistor. The exemplary field effect transistor may be for example a HEMT (High Electron Mobility Transistor).

The electrode structure ES can be located between the source region 10 and the drain region 30. The electrode structure ES or conductive electrode C can extend partially on the semiconductor material or layer between the source region 10 and the drain region 30. The source region 10 includes an electrode and the drain region 30 includes an electrode.

The source region 10 and/or the drain region 30 can include an electrode structure ES1 identical to the electrode structure(s) ES described above. The electrode structure ES1 thus includes, for example, at least one recess and a conductive electrode formed in the at least one recess in the same manner as described above, and extending to be provided on the outer semiconductor material or layer, to define for example an outer element of the device.

The source region and the drain region do not, for example, include the insulating material 6 between the source or drain electrode and the semiconductor material.

The field effect transistor can be, for example, an enhancement-mode field effect transistor having a normally-off gate region.

In some embodiments, semiconductor materials or layers 1, 2 can for example include one or more layers of III-V semiconductor material, such as a III-N semiconductor material including a group III element and nitrogen. Examples of suitable group III-N materials include GaN (Gallium Nitride), $Al_{x1}Ga_{1-x1}N$ (Aluminum Gallium Nitride with any suitable Aluminum content x1) and $Al_{x2}In_{y2}Ga_{z2}N$ (Aluminum Indium Gallium Nitride with any suitable Aluminum, Indium and Gallium contents x2, y2 and z2, respectively, where x2+y2+z2=1 and each of x2, y2 and z2 is greater than or equal to 0 and less than or equal to 1), by way of example.

An embodiment of this structure in a field effect transistor is shown in FIG. 6a where region 20, ES shows the gate electrode containing deep trenched structures along with the multi-channel structure. Regions 10 and 30 correspond to the source and drain, respectively.

FIG. 6b shows a cross section of this structure along the A-A' line as does FIG. 6c but without the insulator material 6 with the electrode C directly contacting the semiconductor material.

The top-view SEM image of an embodiment of this structure is shown in FIG. 7a. FIG. 7b shows a zoomed-in image on the trench regions.

The final challenge is related to the trench etching, which removes electrons from the 2DEG and consequently increases the resistance of devices using these structures. This effect can be compensated by an optimized geometry that minimizes the etched area, maximizes the unetched area. An optimized geometry also uses conduction at sidewall of the trenches, which forms additional channels at sidewall interfaces and reduces the resistance of the deep trenched structure. This is particular important for e-mode HEMTs. Our results on an embodiment of this present disclosure reveal that carrier accumulation at for example the $SiO_2$/GaN interface forms conduction channels in the trenches and contributes to the output current of the Tri-gate. This contribution increases with larger bias, compensating self-heat degradation and improving output linearity of the Tri-gate.

Figure 8:
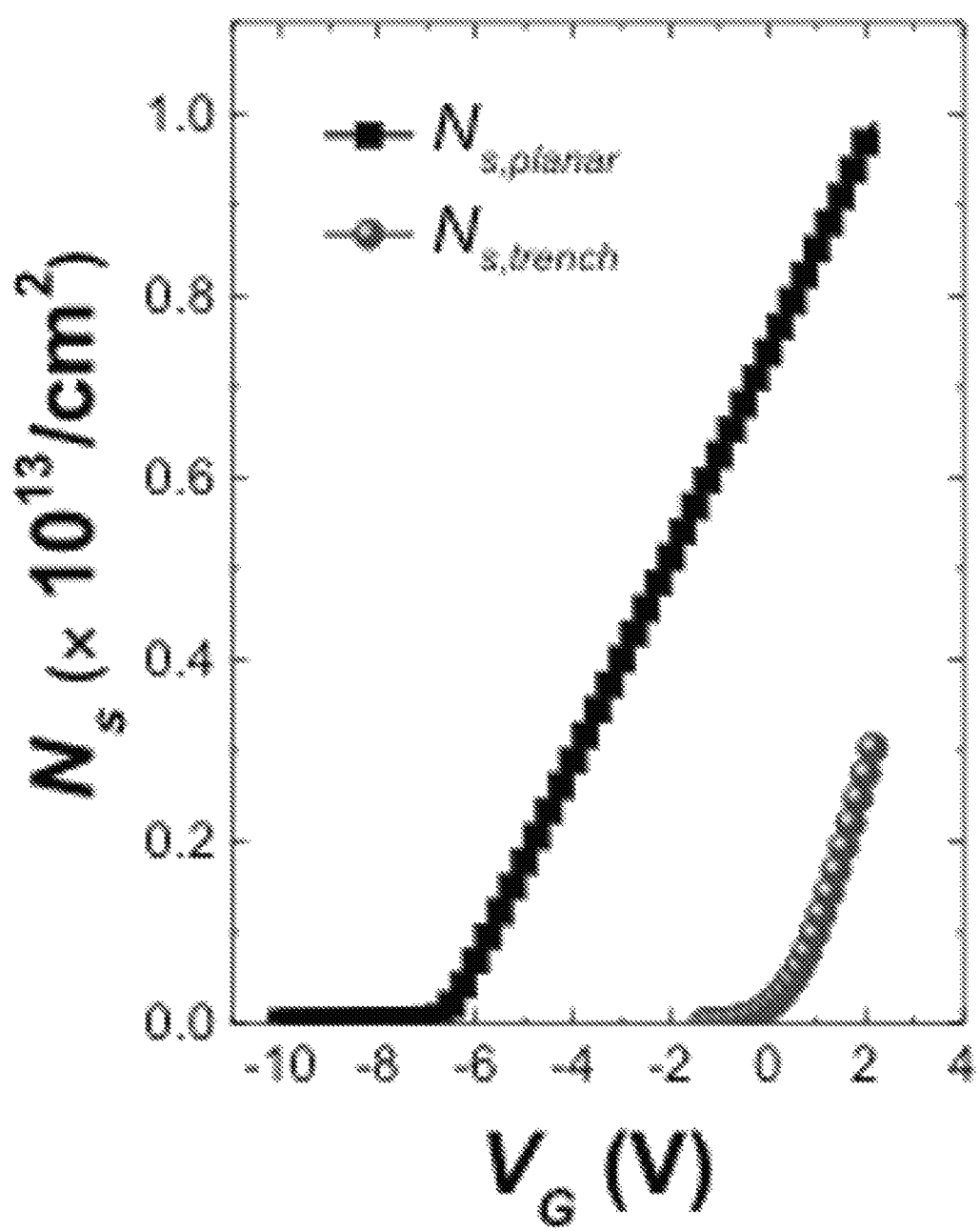
FIG. 8 shows the measured $V_G$-dependent sheet carrier density of the planar HEMT and the trench conduction.

FIG. 8 presents the comparison between the sheet carrier density of the planar HEMT ($N_{s,planar}$) and the trench ($N_{s,trench}$), extracted from the CV measurements. At a $V_G$ of 2 V, the $N_{s,trench}$ was about 28.4% of the $N_{s,planar}$, which represents a significant portion of the carrier density. The relative number of sidewalls can be increased by adjusting the trench dimensions (w3 and 13 in FIG. 4a), which can ultimately compensate the etching of electrons in the multiple channel regions.

Figure 9:
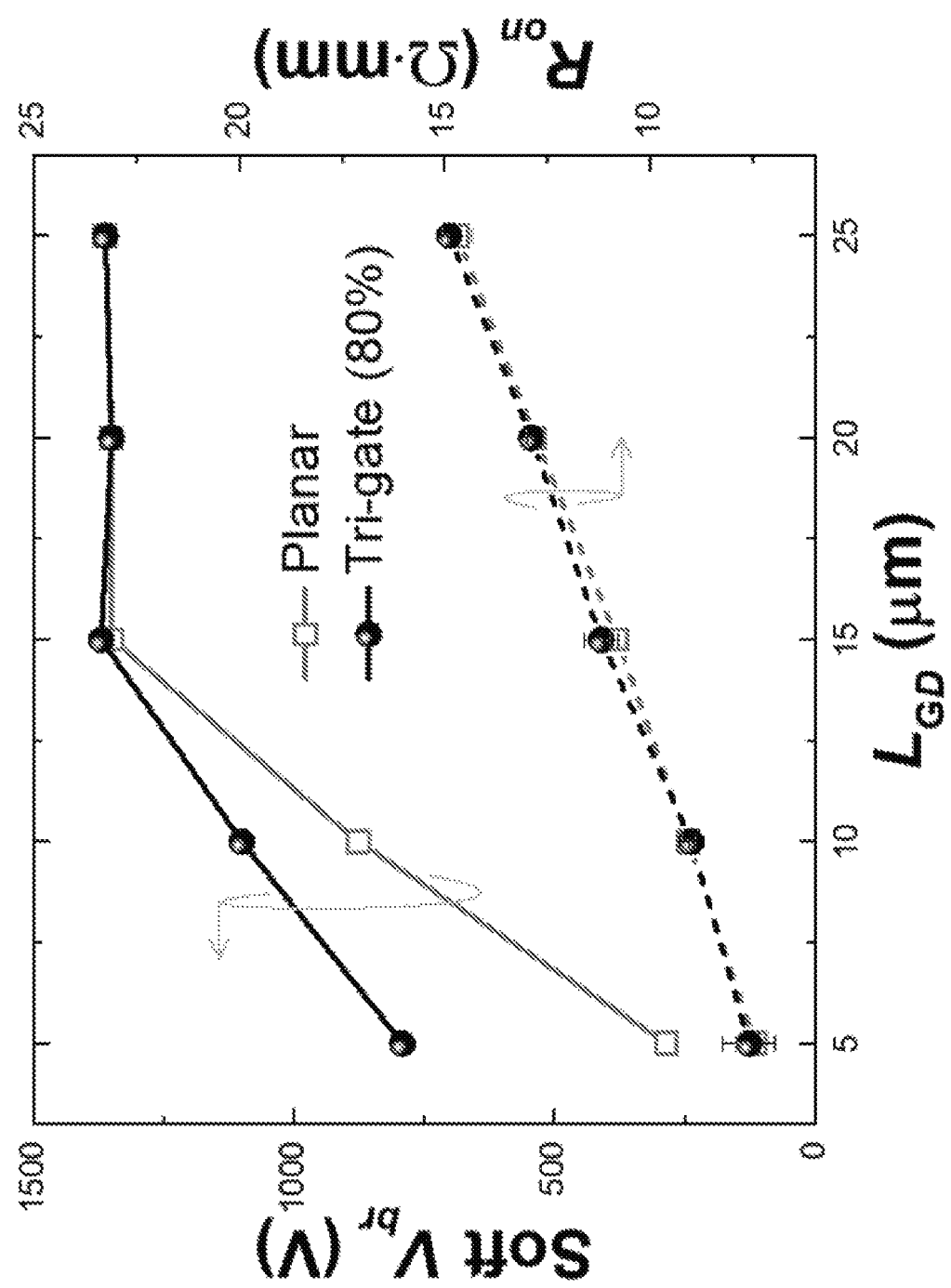
FIG. 9 shows the comparison of on-resistances between recessed (tri-gate) and conventional HEMTs showing that the degradation in on resistance was completely compensated with optimized trench geometry, and also improved the breakdown voltage of the device by integrating a field plate.

With optimized tri-gate geometry and trench conduction, the reduction caused by the 2DEG etch in the deep trenched architecture has been completely compensated. As shown in FIG. 9, the deep trenched HEMT exhibited similar $R_{on}$ with the planar HEMTs, despite its reduced 2DEG area due to trench etching compared to conventional HEMTs. Furthermore, the tri-gate architecture also improves the breakdown voltage of the device by integrating a field plate which is the planar portion of the tri-gate close to the drain side. An optimized trench conduction combined with multi-channel geometry can lead to much smaller on-resistance and larger current/power density over the current planar and tri-gate HEMTs.

The structure or device can be a to a diode that includes a cathode region and an anode region. The diode, includes a first conductive electrode forming a cathode contact, and a second conductive electrode forming an anode contact.

The first conductive electrode forming the cathode contact and/or second conductive electrode forming the anode contact includes the at least one electrode structure ES as described above. The anode or cathode contact thus comprises for example the conductive electrode C formed in the at least one recess 3 and extending to be provided on the outer semiconductor material or layer, to define for example an outer element of the device. The cathode region and the anode region do not for example include the insulating material 6 between the cathode or anode electrode and the semiconductor material.

Various aspects of the devices, apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

While the invention has been disclosed with reference to certain preferred embodiments, numerous modifications, alterations, and changes to the described embodiments, and equivalents thereof, are possible without departing from the sphere and scope of the invention. In particular, the features of any one embodiment may be combined with the features of any other embodiment. Accordingly, it is intended that the invention not be limited to the described embodiments, and be given the broadest reasonable interpretation in accordance with the language of the appended claims.

REFERENCES

[1] Y. Cordier, F. Tatsuya, B. Lu, E. Matioli, and T. Palacios, "Nitride-based electron devices for high-power/high-frequency applications," in *III-Nitride Semiconductors and their Modern Devices*, Oxford University Press, 2013.

[2] B. J. Baliga, "Trends in power semiconductor devices," *IEEE Trans. Electron Devices*, vol. 43, no. 10, pp. 1717-1731, October 1996.

[3] N.-Q. Zhang, B. Moran, S. p. DenBaars, U. k. Mishra, X. w. Wang, and T. p. Ma, "Kilovolt AlGaN/GaN HEMTs as Switching Devices," *Phys. Status Solidi A*, vol. 188, no. 1, pp. 213-217, November 2001.

[4] N. Tipirneni, A. Koudymov, V. Adivarahan, J. Yang, G. Simin, and M. A. Khan, "The 1.6-kV AlGaN/GaN HFETs," *IEEE Electron Device Lett.*, vol. 27, no. 9, pp. 716-718, September 2006.

[5] Y. Dora, A. Chakraborty, L. McCarthy, S. Keller, S. P. DenBaars, and U. K. Mishra, "High Breakdown Voltage Achieved on AlGaN/GaN HEMTs With Integrated Slant Field Plates," *IEEE Electron Device Lett.*, vol. 27, no. 9, pp. 713-715, September 2006.

[6] Y. Uemoto, D. Shibata, M. Yanagihara, H. Ishida, H. Matsuo, S. Nagai, N. Batta, M. Li, T. Ueda, T. Tanaka, and D. Ueda, "8300V Blocking Voltage AlGaN/GaN Power HFET with Thick Poly-AlN Passivation," in *Electron Devices Meeting, 2007. IEDM 2007. IEEE International*, 2007, pp. 861-864.

[7] R. Tülek, A. Ilgaz, S. Gökden, A. Teke, M. K. Öztürk, M. Kasap, S. Özçelik, E. Arslan, and E. Özbay, "Comparison of the transport properties of high quality AlGaN/AlN/GaN and AlInN/AlN/GaN two-dimensional electron gas heterostructures," *J. Appl. Phys.*, vol. 105, no. 1, p. 013707, January 2009.

[8] J. Adhikari and D. A. Kofke, "Molecular simulation study of miscibility of ternary and quaternary InGaAlN alloys," *J. Appl. Phys.*, vol. 95, no. 11, pp. 6129-6137, June 2004.

[9] J. Ma, Q. Zhuang, G. Chen, C. Huang, S. Li, H. Wang, and J. Kang, "Growth Kinetic Processes of AN Molecules on the Al-Polar Surface of AlN," *J. Phys. Chem. A*, vol. 114, no. 34, pp. 9028-9033, September 2010.

[10] W. Chikhaoui, J.-M. Bluet, M.-A. Poisson, N. Sarazin, C. Dua, and C. Bru-Chevallier, "Current deep level transient spectroscopy analysis of AlInN/GaN high electron mobility transistors: Mechanism of gate leakage," *Appl. Phys. Lett.*, vol. 96, no. 7, p. 072107, February 2010.

[11] S. Turuvekere, N. Karumuri, A. A. Rahman, A. Bhattacharya, A. DasGupta, and N. DasGupta, "Gate Leakage Mechanisms in AlGaN/GaN and AlInN/GaN HEMTs: Comparison and Modeling," *IEEE Trans. Electron Devices*, vol. 60, no. 10, pp. 3157-3165, October 2013.

[12] S. Petitdidier, F. Berthet, Y. Guhel, J. L. Trolet, P. Mary, C. Gaquière, and B. Boudart, "Characterization and analysis of electrical trap related effects on the reliability of AlInN/GaN HEMTs,"*Microelectron. Rehab.*, vol. 55, no. 9-10, pp. 1719-1723, August 2015.

[13] S. Yamaguchi, Y. Iwamura, Y. Watanabe, M. Kosaki, Y. Yukawa, S. Nitta, S. Kamiyama, H. Amano, and I. Akasaki, "Electrical properties of strained AlN/GaN superlattices on GaN grown by metalorganic vapor phase epitaxy", *Applied Physics Letters*, Vol. 80, pp. 802-804,2002.

[14] S. Heikman, S. Keller, D. S. Green, S. P. DenBaars, and U. K. Mishra, "High conductivity modulation doped AlGaN/GaN multiple channel heterostructures", *Journal of Applied Physics*, Vol. 94, pp. 5321-5325, 2003.

[15] Y. Cao, K. Wang, G. Li, T. Kosel, H. G. Xing, and D. Jena, "MBE growth of high conductivity single and multiple AlN/GaN heterojunctions", *Journal of Crystal Growth*, Vol. 323, pp. 529-533, 2011.

[16] A. Terano, T. Tsuchiya, K. Mochizuki, S. Tanaka, and T. Nakamura, "GaN-based multi-two-dimensional-electron-gas-channel diodes on sapphire substrates with breakdown voltage of over 3 kV", Japanese *Journal of Applied Physics*, Vol. 54, pp. 066503, 2015.

[17] Commercial AlGaN/GaN HEMTs on Si from Enkris, China, whose website is hap://www.enkris.com/.

[18] R. Tulek, A. IIgaz, S. Gokden, A. Teke, M. K. Ozturk, M. Kasap, S. Ozcelik, E. Arslan, and E. Ozbay, "Comparison of the transport properties of high quality AlGaN/AlN/GaN and AlInN/AlN/GaN two-dimensional electron gas heterostructures", *Journal of Applied Physics*, Vol. 105, pp. 013707, 2009.

[19] R. Wang, G. Li, G. Karbasian, J. Guo, B. Song, Y. Yue, Z. Hu, O. Laboutin, Y. Cao, W. Johnson, G. Snider, P. Fay, D. Jena, H. G. Xing, "Quaternary Barrier InAlGaN HEMTs with $f_T/f_{max}$ of 230/300 GHz", *IEEE Electron Device Letters*, Vol. 34, pp. 378-380, 2013.

[20] W. Saito, Y. Takada, M. Kuraguchi, K. Tsuda, and I. Omura, "Recessed-Gate Structure Approach Toward Normally Off High-Voltage AlGaN/GaN HEMT for Power Electronics Applications", *IEEE Transactions on Electron Devices*, Vol. 53, pp. 356-362, 2006.

[21] Y. Cai, Y. Zhou, K. J. Chen, and K. M. Lau, "High-Performance Enhancement-Mode AlGaN/GaN HEMTs Using Fluoride-Based Plasma Treatment", *IEEE Electron Device Letters*, Vol. 26, pp. 435-437, 2005.

[22] I. Hwang, H. Choi, J. W. Lee, H. S. Choi, J. Kim, J. Ha, C.-Y. Um, S.-K. Hwang, J. Oh, J.-Y. Kim, J. K. Shin, Y. Park, U. Chung, I.-K. Yoo, and K. Kim, "1.6 kV, 2.9mΩ cm$^2$ Normally-off p-GaN HEMT Device", Proceedings of the 24th International Symposium on Power Semiconductor Devices and ICs, pp. 41-44, 2012.

[23] B. Lu, E. Matioli, and T. Palacios, "Tri-Gate Normally-Off GaN Power MISFET," *IEEE Electron Device Lett.*, vol. 33, no. 3, pp. 360-362, March 2012.

The invention claimed is:

1. A semiconductor structure or device comprising a plurality of heterostructures, each heterostructure being formed by at least one first semiconductor material or layer in contact with at least one second semiconductor material or layer, the plurality of heterostructures comprising a plurality of stacked heterostructures defining a plurality of stacked parallel conductive current channels formed at the interface of each heterostructure;

at least one electrode structure defining a gate electrode, the at least one electrode structure comprising at least one recess extending within or through the plurality of heterostructures of the semiconductor structure or device and a conductive electrode, the conductive electrode being in the at least one recess and contacting or being provided on the plurality of heterostructures defining the plurality of stacked parallel conductive current channels, the structure or device is a field effect transistor, and further comprises:
a source region,
a drain region,
the at least one electrode structure being located between the source region and the drain region, the conductive electrode extending partially between the source region and the drain region, and
the at least one electrode structure comprises at least two recesses, the at least two recesses extending within or through the plurality of heterostructures defining a semiconductor region therebetween including the plurality of heterostructures forming the plurality of current channels, and wherein the semiconductor region including the plurality of heterostructures defining the plurality of stacked parallel conductive current channels extends between the source and the drain region to define an hour-glass shape, or a curved hour-glass shape, or a shape comprising a non-diverging section and a diverging section extending from said non-diverging section.

2. The structure or device according to claim 1, wherein the at least one electrode structure is configured to control a current in theft plurality of current channels formed by the plurality of heterostructures at a heterostructure interface.

3. The structure or device according to claim 1, wherein the semiconductor structure or device comprises at least one side wall in the at least one recess, the at least one side wall being defined by the plurality of heterostructures, and the conductive electrode contacts or is provided on the at least one side wall, the conductive electrode partially covering or fully covering the at least one side wall.

4. The structure or device according to claim 1, wherein the semiconductor region includes at least one side wall and/or an upper surface, and the conductive electrode partially covers or fully covers the at least one side wall to form a side wall gate.

5. The structure or device according to claim 1, wherein the semiconductor region includes a first side wall, a second side wall and an upper surface or level extending between the first and second side walls, and the conductive electrode extends along the first side wall to form a first side wall gate, the second side wall to form a second side wall gate and the upper surface to form a top gate to provide simultaneous gate control over the plurality of current channels.

6. The structure or device according to claim 1, wherein the conductive electrode extends to partially fill the at least one recess or each recess.

7. The structure or device according to claim 1, wherein the conductive electrode extends to partially fill the at least one recess or each recess to define a depression in the at least one recess or each recess.

8. The structure or device according to claim 1, wherein the at least one electrode structure defines a field plate structure, or includes at least one field plate electrode for increasing a breakdown voltage of the structure or device, the at least one field plate electrode comprising an electrode in contact or provided on the plurality of heterostructures.

9. The structure or device according to claim 8, wherein the at least one field plate electrode contacts or is integral with the conductive electrode.

10. The structure or device of claim 1, wherein the conductive electrode extends from the at least one recess to form a field plate of the device or field effect transistor.

11. The structure or device according to claim 1, wherein the conductive electrode extends to partially cover the semiconductor region.

12. The structure or device according to claim 1, wherein the curved hour-glass shape comprises or consists of a first side wall and a second side wall extending convergently and divergently with respect to each other in a curved manner.

13. The structure or device according to claim 1, wherein the shape having a non-diverging section and a diverging section extending from the non-diverging section comprises or consists of
 a funnel shape, or
 a first side wall and second side wall including a first portion in which the first side wall and second side wall extend substantially parallel to each other and a second portion in which the first side wall and the second side wall extend divergently with respect to each other, or
 a first side wall and second side wall may for example include a first portion in which the first side wall and second side wall extend substantially parallel to each other and a second portion in which the first side wall and second side wall extend in a curved manner, or
 a first side wall extending a shorter distance than a second side wall, at least one of the first or second side walls including a portion extending divergently with respect to each other.

14. The structure or device according to claim 1, wherein the source region includes a source electrode structure and the drain region includes a drain electrode structure, the source and drain electrode structures comprising at least one recess and a conductive electrode formed in said at least one recess, the at least one recess and conductive electrode extending within or through the plurality of heterostructures.

15. The structure or device according to claim 14, wherein the conductive electrode of the source region and of the drain region extends to partially fill the at least one recess of the source region and the drain region.

16. The structure or device according to claim 15, wherein the conductive electrode of the source region and of the drain region extends to partially fill the at least one recess to define a depression therein.

17. The structure or device according to claim 14, wherein the conductive electrode of the source region and the drain region formed in the at least one recess extends to be provided on the at least one first and the at least one second semiconductor materials or layers to define an outer element of the semiconductor structure or device.

18. A diode comprising
 a plurality of heterostructures, each heterostructure being formed by at least one first semiconductor material or layer in contact with at least one second semiconductor material or layer, the plurality of heterostructures comprising a plurality of stacked heterostructures defining a plurality of stacked parallel conductive current channels;
 at least one electrode structure defining a gate electrode, the at least one electrode structure comprising at least one recess extending within or through the plurality of heterostructures of the semiconductor structure or device and a conductive electrode, the conductive electrode being formed in the at least one recess and contacting or being provided on the plurality of heterostructures defining the plurality of stacked parallel conductive current channels,
the diode further comprising
 a first conductive electrode forming a cathode contact; and
 a second conductive electrode forming an anode contact, the at least one electrode structure being located between the cathode contact and the anode contact, the conductive electrode extending partially between the cathode contact and the anode contact, and
 wherein the at least one electrode structure comprises at least two recesses, the at least two recesses extending within or through the plurality of heterostructures defining a semiconductor region therebetween including the plurality of heterostructures forming the plurality of current channels, and
 wherein the semiconductor region including the plurality of heterostructures defining the plurality of stacked parallel conductive current channels extends between the cathode contact and the anode contact to define an hour-glass shape, or a curved hour-glass shape, or a shape comprising a non-diverging section and a diverging section extending from said non-diverging section.

19. The diode of claim 18, wherein the first conductive electrode forming the cathode contact and/or second conductive electrode forming the anode contact includes the at least one electrode structure comprising the conductive electrode formed in the at least one recess.

20. The diode of claim 19, wherein the diode further comprises an insulating region between the semiconductor material or layer and the conductive electrode, the insulating region extending at least partially across an interface between the semiconductor material or layer and the conductive electrode.

* * * * *